(12) United States Patent
Sanders et al.

(10) Patent No.: US 10,631,395 B2
(45) Date of Patent: Apr. 21, 2020

(54) INDUCTIVELY COUPLED PULSED RF VOLTAGE MULTIPLIER

(71) Applicant: Transient Plasma Systems, Inc., Torrance, CA (US)

(72) Inventors: Jason M. Sanders, Los Angeles, CA (US); Mark Thomas, Redondo Beach, CA (US)

(73) Assignee: TRANSIENT PLASMA SYSTEMS, INC., Torrance, CA (US)

(*) Notice: Subject to any disclaimer, the term of this patent is extended or adjusted under 35 U.S.C. 154(b) by 0 days.

(21) Appl. No.: 16/254,140

(22) Filed: Jan. 22, 2019

(65) Prior Publication Data
US 2019/0230779 A1    Jul. 25, 2019

Related U.S. Application Data

(60) Provisional application No. 62/620,278, filed on Jan. 22, 2018.

(51) Int. Cl.
| | | |
|---|---|---|
| H05H 1/46 | (2006.01) | |
| H03K 5/02 | (2006.01) | |
| H01J 37/32 | (2006.01) | |

(52) U.S. Cl.
CPC ............ *H05H 1/46* (2013.01); *H01J 37/321* (2013.01); *H01J 37/32082* (2013.01); *H01J 37/32146* (2013.01); *H01J 37/32174* (2013.01); *H03K 5/02* (2013.01); *H05H 2001/4652* (2013.01); *H05H 2001/4682* (2013.01)

(58) Field of Classification Search
CPC combination set(s) only.
See application file for complete search history.

(56) References Cited

U.S. PATENT DOCUMENTS

| | | | |
|---|---|---|---|
| 3,832,568 A | 8/1974 | Wang | |
| 4,433,669 A | 2/1984 | Ishikawa et al. | |
| 4,677,960 A | 7/1987 | Ward | |
| 5,157,267 A | 10/1992 | Shirata et al. | |
| 5,563,780 A * | 10/1996 | Goad | H02J 1/102 307/82 |
| 6,235,249 B1 | 5/2001 | Chen | |

(Continued)

FOREIGN PATENT DOCUMENTS

| | | |
|---|---|---|
| CN | 105207256 A | 12/2015 |
| CN | 105673139 A | 6/2016 |

(Continued)

OTHER PUBLICATIONS

Maytin, Edward V., et al., "Stress-Inducible Transcription Factor CHOP/gadd153 Induces Apoptosis in Mammalian Cells via p38 Kinase-Dependent and -Independent Mechanisms", Experimental Cell Research, 2001; vol. 267, pp. 193-204.

(Continued)

*Primary Examiner* — An T Luu
(74) *Attorney, Agent, or Firm* — Cozen O'Connor

(57) ABSTRACT

Systems and methods for increasing the RF power switched into a resonant load by achieving voltage multiplication by means of coupled inductors are provided herein. In one approach, the RF electromagnetic wave achieved by voltage multiplication is used to drive a diode opening switch in order to create a fast rising, unipolar electrical pulse.

18 Claims, 2 Drawing Sheets

(56) References Cited

U.S. PATENT DOCUMENTS

| | | | |
|---|---|---|---|
| 6,317,341 B1* | 11/2001 | Fraidlin | H02M 1/4258 363/21.04 |
| 6,426,666 B1 | 7/2002 | Li et al. | |
| 6,633,017 B1 | 10/2003 | Drummond et al. | |
| 6,831,377 B2 | 12/2004 | Yampolsky et al. | |
| 6,906,280 B2 | 6/2005 | Rosocha | |
| 7,767,433 B2 | 8/2010 | Kuthi et al. | |
| 7,817,396 B2 | 10/2010 | Tao et al. | |
| 7,901,929 B2 | 3/2011 | Kuthi et al. | |
| 7,901,930 B2 | 3/2011 | Kuthi et al. | |
| 8,115,343 B2 | 2/2012 | Sanders et al. | |
| 8,120,207 B2 | 2/2012 | Sanders et al. | |
| 8,212,541 B2 | 7/2012 | Perreault et al. | |
| 8,226,901 B2 | 7/2012 | Makita et al. | |
| 8,418,668 B2 | 4/2013 | Shimizu | |
| 8,854,019 B1 | 10/2014 | Levesque et al. | |
| 8,908,401 B2* | 12/2014 | Hiltbrunner | H02M 3/1584 363/71 |
| 9,080,547 B2 | 7/2015 | Shiraishi et al. | |
| 9,617,965 B2 | 4/2017 | Sanders et al. | |
| 9,831,776 B1 | 11/2017 | Jiang et al. | |
| 10,072,629 B2 | 9/2018 | Sanders et al. | |
| 10,128,745 B2 | 11/2018 | Low et al. | |
| 2003/0116148 A1 | 6/2003 | Sakakura | |
| 2004/0182832 A1 | 9/2004 | Rosocha | |
| 2005/0218423 A1 | 10/2005 | Shimizu et al. | |
| 2005/0279337 A1 | 12/2005 | Biljenga | |
| 2006/0062074 A1 | 3/2006 | Gundersen et al. | |
| 2007/0031959 A1 | 2/2007 | Kuthi et al. | |
| 2007/0262721 A1 | 11/2007 | Camilli | |
| 2008/0231337 A1 | 9/2008 | Krishnaswamy et al. | |
| 2008/0274632 A1 | 11/2008 | Lenfert et al. | |
| 2009/0126668 A1 | 5/2009 | Shiraishi et al. | |
| 2009/0126684 A1 | 5/2009 | Shiraishi et al. | |
| 2010/0038971 A1 | 2/2010 | Sanders et al. | |
| 2010/0156195 A1 | 6/2010 | Sanders et al. | |
| 2011/0069514 A1* | 3/2011 | Chiba | H02M 3/33569 363/21.02 |
| 2011/0267113 A1 | 11/2011 | Carmon et al. | |
| 2014/0109886 A1 | 4/2014 | Singleton et al. | |
| 2014/0230770 A1 | 8/2014 | Kuthi et al. | |
| 2014/0346875 A1 | 11/2014 | Chinga et al. | |
| 2015/0280553 A1 | 10/2015 | Giuliano et al. | |
| 2016/0069320 A1 | 3/2016 | Idicheria et al. | |
| 2016/0254754 A1 | 9/2016 | Perreault et al. | |
| 2018/0269793 A1* | 9/2018 | Ahsanuzzaman | H02M 3/33523 |
| 2019/0032623 A1 | 1/2019 | Idicheria et al. | |
| 2019/0229615 A1* | 7/2019 | Sanders | H02M 3/07 |
| 2019/0229623 A1 | 7/2019 | Tsuda et al. | |

FOREIGN PATENT DOCUMENTS

| | | |
|---|---|---|
| JP | 2006081277 A | 3/2006 |
| JP | 2012184718 A | 9/2012 |
| JP | 2013144127 A | 7/2013 |
| KR | 10-1995-0003730 | 2/1995 |
| KR | 20100023304 A | 3/2010 |
| KR | 20100046734 A | 5/2010 |
| KR | 101846046 B1 | 4/2018 |
| WO | 2010011408 A1 | 1/2010 |
| WO | 2013134573 A1 | 9/2013 |
| WO | 2014066095 A1 | 5/2014 |
| WO | 2015095140 A1 | 6/2015 |
| WO | 2019143992 A1 | 7/2019 |
| WO | 2019144037 A1 | 7/2019 |

OTHER PUBLICATIONS

McDonald, Jacob D., et al., "Emissions from Charbroiling and Grilling of Chicken and Beef", Journal of the Air & Waste Management Association, 2003; vol. 53, No. 2, pp. 185-194.

Moll, John L., et al., "Physical Modeling of the Step Recovery Diode for Pulse and Harmonic Generation Circuits", Proceedings of the IEEE, Jul. 1969; vol. 57, No. 7, pp. 1250-1259.

Oberdorster, Gunter, et al., "Nanotoxicology: An Emerging Discipline Evolving from Studies of Ultrafine Particles", Environmental Health Perspectives, vol. 113, No. 7; Jul. 2005; pp. 823-839.

Perryman, Pamela, "Preliminary Draft Staff Report: Proposed Amended Rule 1138—Control of Emissions from Restaurant Operations", South Coast Air Quality Management District; Planning, Rule Development, and Area Sources, Aug. 2009, in 27 pages.

Pogue, Brian W., et al., "In Vivo NADH Fluorescence Monitoring as an Assay for Cellular Damage in Photodynamic Therapy", Photochemistry and Photobiology, 2001; vol. 74, No. 6, pp. 817-824.

Polevaya, Yulia, et al., "Time domain dielectric spectroscopy study of human cells II. Normal and malignant white blood cells", Biochimica et Biophysica Acta, 1999; vol. 1419, pp. 257-271.

Pope III, C. Arden, et al., "Lung Cancer, Cardiopulmonary Mortality, and Long-term Exposure to Fine Particulate Air Pollution", JAMA, Mar. 6, 2002; vol. 287, No. 9, pp. 1132-1141.

Rajanikanth, B.S., et al., "Discharge Plasma Treatment for NOx Reduction from Diesel Engine Exhaust: A Laboratory Investigation", IEEE Transactions on Dielectrics and Electrical Insulation, vol. 12, No. 1; Feb. 2005, pp. 72-80.

Rukin, S.N., "High-Power Nanosecond Pulse Generators Based on Semiconductor Opening Switches (Review)", Instruments and Experimental Techniques, 1999; vol. 42, No. 4, pp. 439-467.

Samet, Jonathan M., et al., "Fine Particulate Air Pollution and Mortality in 20 U.S. Cities, 1987-1994", The New England Journal of Medicine, Massachusetts Medical Society; Dec. 14, 2000; vol. 343, No. 24, pp. 1742-1749.

Sanders, J., et al., "Broadband Power Measurement of High-Voltage, Nanosecond Electric Pulses for Biomedical Applications", IEEE International Power Modulator Conference, Las Vegas, NV, 2008; pp. 350-353.

Schoenbach, Karl H., et al., "The Effect of Pulsed Electric Fields on Biological Cells: Experiments and Applications", IEEE Transactions on Plasma Science, Apr. 1997; vol. 25, No. 2, pp. 284-292.

Tang, Tao, et al., "Diode Opening Switch Based Nanosecond High Voltage Pulse Generators for Biological and Medical Applications", IEEE Transactions on Dielectrics and Electrical Insulation, Aug. 2007; vol. 14, No. 4; pp. 878-883.

Wakita, Masayoshi, et al., "Some Characteristics of the Fluorescence Lifetime of Reduced Pyridine Nucleotides in Isolated Mitochondria, Isolated Hepatocytes, and Perfused Rat Liver In Situ", J. Biochem., 1995; vol. 118, No. 6, pp. 1151-1160.

Wang, Fei, et al., "Solid-State High Voltage Nanosecond Pulse Generator", IEEE Pulsed Power Conference, Abstract No. #10123, pp. 1199-1202.

Watanabe, Kenji, et al., "Feasibility and limitations of the rat model by C6 gliomas implanted at the subcutaneous region", Neurological Research; Jul. 2002, vol. 24, No. 5; pp. 485-490.

Weaver, James C., et al., "Theory of electroporation: A review", Bioelectrochemistry and Bioenergetics, 1996; vol. 41, pp. 135-160.

Webb, S.E.D., et al., "A wide-field time-domain fluorescence lifetime imaging microscope with optical sectioning", Review of Scientific Instruments, Apr. 2002; vol. 73, No. 4, pp. 1898-1907.

Weiss, Arthur, et al., "The role of T3 surface molecules in the activation of human t cells: a two-stimulus requirement for IL 2 production reflects events occurring at a pre-translational level", The Journal of Immunology, vol. 133, No. 1; Jul. 1984, pp. 123-128.

Yancey, J.W.S., et al., "Cookery method and endpoint temperature can affect the Warner-Bratzler shear force, cooking loss, and internal cooked color of beef semimembranosus and infraspinatus steaks", J. Anim. Sci. 2016, vol. 94, pp. 4434-4446.

Zhu, Xuemei, et al., "Mouse cone arrestin gene characterization: promoter targets expression to cone photoreceptors", FEBS Letters, 2002; vol. 524, pp. 116-122.

Zhu, Xuemei, et al., "The Carboxyl Terminal Domain of Phosducin Functions as a Transcriptional Activator", Biochemical and Biophysical Research Communications, 2000; vol. 270, pp. 504-509.

Extended European Search Report for European Application No. 09800737.0 dated Apr. 25, 2014 in 10 pages.

(56) References Cited

OTHER PUBLICATIONS

Hewlett Packard. Application Note 918, Pulse and Waveform Generation with Step Recovery Diodes. Oct. 1984. 22 pages.
International Search Report and Written Opinion for PCT/US2013/064955 dated Jan. 21, 2014 in 7 pages.
International Search Report and Written Opinion for PCT/US2019/014273 dated May 9, 2019 in 10 pages.
International Search Report and Written Opinion for PCT/US2019/014339 dated May 8, 2019 in 11 pages.
International Search Report for PCT/US2014/070518, dated Mar. 31, 2015, 2 pages.
International Search Report from PCT Application No. PCT/US2009/045073 dated Jan. 28, 2010 in 2 pages.
Kuthi, Andras, U.S. Appl. No. 61/767,044, filed Feb. 20, 2013, "Transient Plasma Electrode for Radical Generation." 7 pages.
Written Opinion for PCT/US2014/070518, dated Mar. 31, 2015, 4 pages.
Babaie, Meisam , et al., "Effect of Pulsed Power on Particle Matter in Diesel Engine Exhaust Using a DBD Plasma Reactor", IEEE Transactions on Plasma Science, vol. 41, No. 8; Aug. 2013, pp. 2349-2358.
Babaie, M. , et al., "Influence of non-thermal plasma after-treatment technology on diesel engine particulate matter composition and NOx concentration", Int. J. Environ. Sci. Technol. 2016, vol. 13; pp. 221-230.
Barth, Rolf F., "Rat brain tumor models in experimental neuro-oncology: The 9L, C6, T9, F98, RG2 (D74), RT-2 and CNS-1 Gliomas", Journal of Neuro-Oncology, 1998; vol. 36, pp. 91-102.
Behrend, M.R. , et al., "Nanosecond Pulse Generator Using Fast Recovery Diodes for Cell Electromanipulation", IEEE Transactions on Plasma Science, IEEE Service Center, Piscataway, New Jersey; vol. 33, No. 4, Aug. 1, 2005, pp 1192-1197.
Bier, Martin , et al., "Kinetics of Sealing for Transient Electropores in Isolated Mammalian Skeletal Muscle Cells", Bioelectromagnetics, vol. 20, 1999; pp. 194-201.
Borner, Markus M., et al., "The detergent Triton X-100 induces a death pattern in human carcinoma cell lines that resembles cytotoxic lymphocyte-induced apoptosis", FEBS Letters (1994), vol. 353, pp. 129-132.
Chae, J.-O. , "Non-thermal plasma for diesel exhaust treatment", Journal of Electrostatics, Slesvier Science B.V., vol. 57, 2003, pp. 251-262.
Chang, J.S. , "Physics and chemistry of plasma pollution control technology", Plasma Sources Science and Technology; IOP Publishing, vol. 17, 2008; pp. 1-6.
Chow, Judith C., et al., "Health Effects of Fine Particulate Air Pollution: Lines that Connect", Journal of the Air & Waste Management Association, 2006; vol. 56, No. 10, pp. 1368-1380.
Cole, M.J. , et al., "Time-domain whole-field fluorescence lifetime imaging with optical sectioning", Journal of Microscopy, vol. 203, Pt 3, Sep. 2001, pp. 246-257.
Cossarizza, Andrea , et al., "Chapter 21: Analysis of Mitochondria during Cell Death", Methods in Cell Biology, vol. 63, 2001; pp. 467-486.
Craft, Cheryl M., et al., "PhLPs and PhLOPs in the Phosducin Family of G beta gamma Binding Proteins", Biochemistry, American Chemical Society, 1998; vol. 37, pp. 15758-15772.
Cubeddu, R. , et al., "Time-resolved fluorescence imaging in biology and medicine", Topical Review; Institute of Physics Publishing, Journal of Physics D: Applied Physics; vol. 35, 2002; pp. R61-R76.
Deangelis, Lisa M., "Brain Tumors", New England Journal of Medicine, Jan. 11, 2001; vol. 344, No. 2, pp. 114-123.
Debruin, Katherine A., et al., "Modeling Electroporation in a Single Cell. I. Effects of Field Strength and Rest Potential", Biophysical Journal, Sep. 1999; vol. 77, pp. 1213-1224.
Dockery, Douglas W., et al., "An Association Between Air Pollution and Mortality in Six U.S. Cities", The New England Journal of Medicine; Dec. 9, 1993; vol. 329, No. 24, pp. 1753-1759.

Frank, K. , et al., "High-Power Pseudospark and BLT Switches", IEEE Transactions on Plasma Science, European Organization for Nuclear Research, Apr. 1988; vol. 16, No. 2, pp. 317-323.
Freeman, Scott A., et al., "Theory of Electroporation of Planar Bilayer Membranes: Predictions of the Aqueous Area, Change in Capacitance, and Pore-Pore Separation", Biophysical Journal, Jul. 1994; vol. 67, pp. 42-56.
Garon, E.B. , et al., 2007 In Vitro and In Vivo Evaluation and a Case Report of Intense Nanosecond Pulsed Electric Field as a Local Therapy for Human Malignancies. Int. J. Cancer, vol. 121: pp. 675-682.
Gotoh, Tomomi , et al., "Nitric Oxide-induced Apoptosis in RAW 264.7 Macrophages Is Mediated by Endoplasmic Reticulum Stress Pathway Involving ATF6 and CHOP", The Journal of Biological Chemistry, The American Society for Biochemistry and Molecular Biology, Inc.; 2002; vol. 277, No. 14, pp. 12343-12350.
Grekhov, I.V. , et al., "Formation of nanosecond high-voltage drops across semiconductor diodes with voltage recovery by a drift mechanism", Sov. Tech. Phys. Lett., 1983; vol. 9, No. 4, pp. 188-189.
Grekhov, I.V. , et al., "Nanosecond semiconductor diodes for pulsed power switching", Physics-Uspekhi, Russian Academy of Sciences, 2005; vol. 48, No. 7; pp. 703-712.
Grekhov, Igor V., et al., "Physical Basis for High-Power Semiconductor Nanosecond Opening Switches", IEEE Transactions on Plasma Science, Oct. 2000; vol. 28, No. 5, pp. 1540-1544.
Gundersen, M. , et al., "Nanosecond Pulse Generator Using a Fast Recovery Diode", IEEE 26th Power Modulator Conference, 2004; pp. 603-606.
Gysel, Nicholas , et al., "Particulate matter emissions and gaseous air toxic pollutants from commercial meat cooking operations", Journal of Environmental Sciences; The Research Center for Eco-Environmental Sciences, Chinese Academy of Sciences; vol. 65, 2018, pp. 162-170.
Hackam, R. , et al., "Air Pollution Control by Electrical Discharges", IEEE Transactions on Dielectrics and Electrical Insulation, vol. 7, No. 5, Oct. 2000, pp. 654-683.
Hemker, R.G. , et al., "Development of a Parallel Code for Modeling Plasma Based Accelerators", Proceedings of the 1999 Particle Accelerator Conference, New York, 1999; pp. 3672-3674.
Joshi, R.P. , et al., "Electroporation Dynamics in Biological Cells Subjected to Ultrafast Electrical Pulses: A Numerical Simulation Study", Physical Review E, vol. 62, No. 1; Jul. 2000; pp. 1025-1033.
Kaltsonoudis, Christos , et al., "Characterization of fresh and aged organic aerosol emissions from meat charbroiling", Atmospheric Chemistry and Physics, vol. 17, 2017; pp. 7143-7155.
Kirkman, George F., et al., "Low pressure, light initiated, glow discharge switch for high power applications", Appl. Phys. Lett.; American Institute of Physics, 1986; vol. 49, pp. 494-495.
Kotnik, Tadej , et al., "Theoretical Evaluation of the Distributed Power Dissipation in Biological Cells Exposed to Electric Fields", Bioelectromagnetics, vol. 21; 2000; pp. 385-394.
Kotov, Yu A., et al., "Novel nanosecond semiconductor opening switch for megavolt repetitive pulsed power technology: experiment and applications", In Proceedings of the 9th Int. IEEE Pulsed Power Conference, Albuquerque, NM, 1993; SPIE vol. 2374; pp. 98-103.
Kuroki, Tomoyuki , et al., "Single-Stage Plasma-Chemical Process for Particulates, Nox, and SOx Simultaneous Removal", IEEE Transactions on Industry Applications, vol. 38, No. 5, Sep./Oct. 2002, pp. 1204-1209.
Kuthi, A. , et al., "Nanosecond pulse generator using a fast recovery diode", Power Modulator Symposium, 2004 and 2004 High-Voltage Workshop. Conference Record of the 26th International San Francisco, CA May 23-26, 2004; IEEE, pp. 603-606.
Lee, Jun-Bok , et al., "Emission Rate of Particulate Matter and Its Removal Efficiency by Precipitators in Under-Fired Charbroiling Restaurants", TheScientificWorldJOURNAL, TSW Environment; 2011, vol. 11, pp. 1077-1088.

(56) References Cited

OTHER PUBLICATIONS

Li, Aimin et al. "Gene Expression Networks Underlying Retinoic Acid-Induced Differentiation of Human Retinoblastoma Cells", Investigative Ophthalmology & Visual Science, Mar. 2003; vol. 44, No. 3, pp. 996-1007.
Li, Aimin, et al., "Retinoic Acid Upregulates Cone Arrestin Expression in Retinoblastoma Cells through a Cis Element in the Distal Promoter Region", Investigative Ophthalmology & Visual Science, May 2002; vol. 43, No. 5, pp. 1375-1383.
Lyubutin, S.K., et al., "Repetitive Nanosecond All-Solid-State Pulsers Based on SOS Diodes", Institute of Electrophysics; Russian Academy of Sciences, Ural Division; IEEE 11th International Pulsed Power Conference, Baltimore, MD; pp. 992-998.
Marcu, Laura, et al., "Photobleaching of Arterial Fluorescent Compounds: Characterization of Elastin, Collagen and Cholesterol Time-resolved Spectra during Prolonged Ultraviolet Irradiation", Photochemistry and Photobiology, 1999; vol. 69, No. 6, pp. 713-721.
Marszalek, Piotr, et al., "Schwan equation and transmembrane potential induced by alternating electric field", Biophysical Journal, Oct. 1990; vol. 58, pp. 1053-1058.
Matsumoto, Takao, et al., "Energy Efficiency Improvement of Nitric Oxide Treatment Using Nanosecond Pulsed Discharge", IEEE Transactions on Plasma Science; vol. 38, No. 10, Oct. 2010; pp. 2639-2643.
International Search Report and Written Opinion for PCT/US2019/041228. dated Nov. 12, 2019, 10 pages.
Gilbert, Richard A., "Novel Electrode Designs for Electrochemotherapy", Biochimica et Biophysica Acta 1334, 1997, pp. 9-14.

\* cited by examiner

INDUCTIVELY COUPLED PULSED RF VOLTAGE MULTIPLIER

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

Technical Field

The present disclosure relates to systems and methods to produce high voltage, high power nanosecond pulses, which may, for example, be advantageously employed in the generation of non-thermal plasmas. More particularly, the present disclosure relates to inductively coupled pulsed radio frequency (RF) voltage multiplier circuits, and methods for generating pulsed RF waveforms.

BACKGROUND

Description of the Related Art

Pulsed radio frequency (RF) electromagnetic fields are used for numerous applications, including driving diode opening switches for the purpose of generating fast rising, unipolar pulses. One method for generating a pulsed RF electromagnetic field is to discharge a capacitor charged to a DC level into a resonant circuit. The maximum peak power of the electromagnetic wave that can be achieved is limited by the impedance of the resonant circuit and by the maximum voltage that can be held-off by the switch used to discharge the capacitor.

BRIEF SUMMARY

In order to increase the peak power and total energy of the pulsed RF discharge, a method to achieve voltage multiplication by inductive coupling has been developed. This disclosure describes electrical circuitry designed to achieve multiplication of the DC voltage that is switched into a resonant RF load.

Briefly and in general terms, the present disclosure is directed to a system for generating an RF pulse that energizes a high voltage opening switch for the purpose of producing high voltage pulses with high instantaneous power. In the various embodiments provided by the present disclosure, an inductively coupled pulsed RF voltage multiplier is used to drive a switch, such as a diode opening switch, that generates a nanosecond-scale high voltage pulse, which may be used, for example, for generating non-equilibrated plasmas and/or pulsed electric fields.

In some embodiments, the inductively coupled pulsed RF voltage multiplier circuitry is directly powered by an available DC power source, and, depending on the desired attributes of the pulse, which may vary depending on application, the DC power source may be adjustable between 0-1,200 VDC. In some embodiments, a large valued, high voltage resistor may be used to isolate the pulsed RF signal generated by the inductively coupled pulsed RF voltage multiplier circuitry from the DC source.

In other embodiments, capacitor charging circuitry may be used to isolate the inductively coupled pulsed RF voltage multiplier circuitry from the DC source and to provide a means to rapidly charge the input capacitance of the inductively coupled pulsed RF voltage multiplier circuitry.

As disclosed herein, the inductively coupled pulsed RF voltage multiplier switches electrical energy into a tuned resonant circuit with known impedance and natural frequency. To achieve voltage multiplication, the inductively coupled pulsed voltage multiplier includes a plurality of ground referenced switching stages, each of which is inductively coupled to the resonant circuit in a way that combines each switching stage in series. More particularly, the switching stages are electrically coupled to one another in parallel, and are inductively coupled to the tuned resonant circuit across respective transformers. The secondary windings of each of the transformers are electrically coupled in series to one another and to the resonant circuit, so that a DC charging voltage supplied to each of the switching stages is multiplied and supplied to the inductively coupled resonant circuit due to the series coupling of the secondary windings of the transformers. The input capacitance of the inductively coupled pulsed RF voltage multiplier circuitry is tuned together with the resonant load to achieve the desired impedance, natural frequency, and wave shape.

The inductively coupled pulsed RF voltage multiplier circuitry disclosed herein generally may be used to generate a high power pulse of RF energy. Depending on the design of the resonant circuit, this energy may be dissipated in a resistive load or allowed to oscillate until the energy dissipates by means of copper loss and/or dielectric loss mechanisms.

In one or more embodiments described herein, the inductively coupled pulsed RF voltage multiplier circuitry is used to drive a two-pole resonant circuit for three-quarters of one cycle of the natural frequency. Because there is a practical limit to the lowest resonant impedance that can be achieved, and, because there is a limit to the maximum voltage a given switch can hold-off, the inductively coupled pulsed RF voltage multiplier may be used to increase the amount of electrical energy that is switched into the resonant circuit. In one or more embodiments, the energy that is switched into the resonant circuit drives a diode opening switch, which is designed to interrupt the current flowing through it at a moment when the pulse energy is stored in the output inductance of the resonant circuit. The rapid interruption of current creates a high voltage pulse of nanosecond-scale duration.

In one or more embodiments, the present disclosure provides a method for generating a pulsed radio frequency (RF) waveform that includes voltage multiplying a DC charging voltage by: supplying the DC charging voltage to respective capacitors of a plurality of switching stages that are electrically coupled to one another in parallel, each of the switching stages including a switching stage capacitor, a switching stage inductor, and a switch; discharging the capacitors by concurrently switching the switches of each of the plurality of switching stages from an electrically non-conducting state to an electrically conducting state; and inductively coupling each of the plurality of switching stages to a resonant circuit through a plurality of transformers, each of the transformers having a primary winding electrically coupled to a respective switching stage and a secondary winding electrically coupled in series to one another and to the resonant circuit.

In another embodiment, the present disclosure provides a pulsed radio frequency (RF) voltage multiplier circuit that includes a plurality of switching circuits coupled to one another in parallel. Each of the switching circuits includes a switching circuit capacitor, a switching circuit inductor, and a switch. The pulsed RF voltage multiplier circuit further includes a plurality of transformers, with each of the transformers having a respective primary winding electrically coupled to a respective one of the switching circuits. A resonant circuit is inductively coupled to the plurality of switching circuits through secondary windings of each of the plurality of transformers, and the secondary windings of the plurality of transformers are electrically coupled to one another in series.

The structures, articles and methods described herein can be advantageously employed in a variety of different applications. For example, the structures, articles and methods described herein can be employed to generate pulsed power to produce a plasma, for instance a non-thermal plasma. Such can, for example, be advantageously used in applications involving pulsed power to improve efficiency of performance of combustion engines. For example, structures, articles and methods described herein may be implemented as part of, or in connection with a signal generating source that supplies pulsed power to a transient plasma circuit (e.g., via a standard ignition coil) that outputs at least one signal (e.g., an electrical pulse having a voltage and a current) that is destined to breakdown over a spark gap (e.g., the spark gap of a spark plug, a static spark gap, a rotary spark gap, and the like) at a first voltage. For example, the transient plasma circuit may be integrated into a spark plug or at any location between the signal generating source and the spark gap. The signal generating source may be integrated into the transient plasma circuit. Such can, for example, be advantageously used in applications involving pulsed power to treat textiles.

The foregoing summary does not encompass the claimed subject matter in its entirety, nor are the embodiments intended to be limiting. Rather, the embodiments are provided as mere examples.

The present disclosure addresses these and other needs.

Other features of the disclosed embodiments will become apparent from the following detailed description, taken in conjunction with the accompanying drawings, which illustrate, by way of example, the principles of the disclosed embodiments.

DETAILED DESCRIPTION

The present disclosure is generally directed to inductively coupled pulsed RF voltage multiplier circuits and methods of generating a high power RF pulse, including but not limited to the use of such circuits and methods for the purpose of generating a waveform that is suitable for driving a diode opening switch. Diode opening switches are typically designed to rapidly transition into a non-conducting reversed bias state at a time when electrical current is flowing from cathode to anode through the device. This rapid transition from a conducting to non-conducting state interrupts the current flowing from cathode to anode, and this current is diverted to a load, where it creates a fast rising electrical pulse. The voltage amplitude of the pulse is proportional to $i \times Z_L$, where I is the electrical current and $Z_L$ is the load impedance. For a given load impedance, the amplitude of the voltage pulse is directly proportional to the value of the current, i, which in turn is proportional to the square root of the energy switched into the resonating circuit that drives the diode opening switch. Because there is a practical limit to the lowest resonant impedance that can be achieved, and, because there is a limit to the maximum voltage a given switch can hold-off, the inductively coupled pulsed RF voltage multiplier is used to increase the amount of electrical energy that is switched into the resonant circuit to achieve a higher voltage amplitude that is switched across the load impedance.

Figure 1:
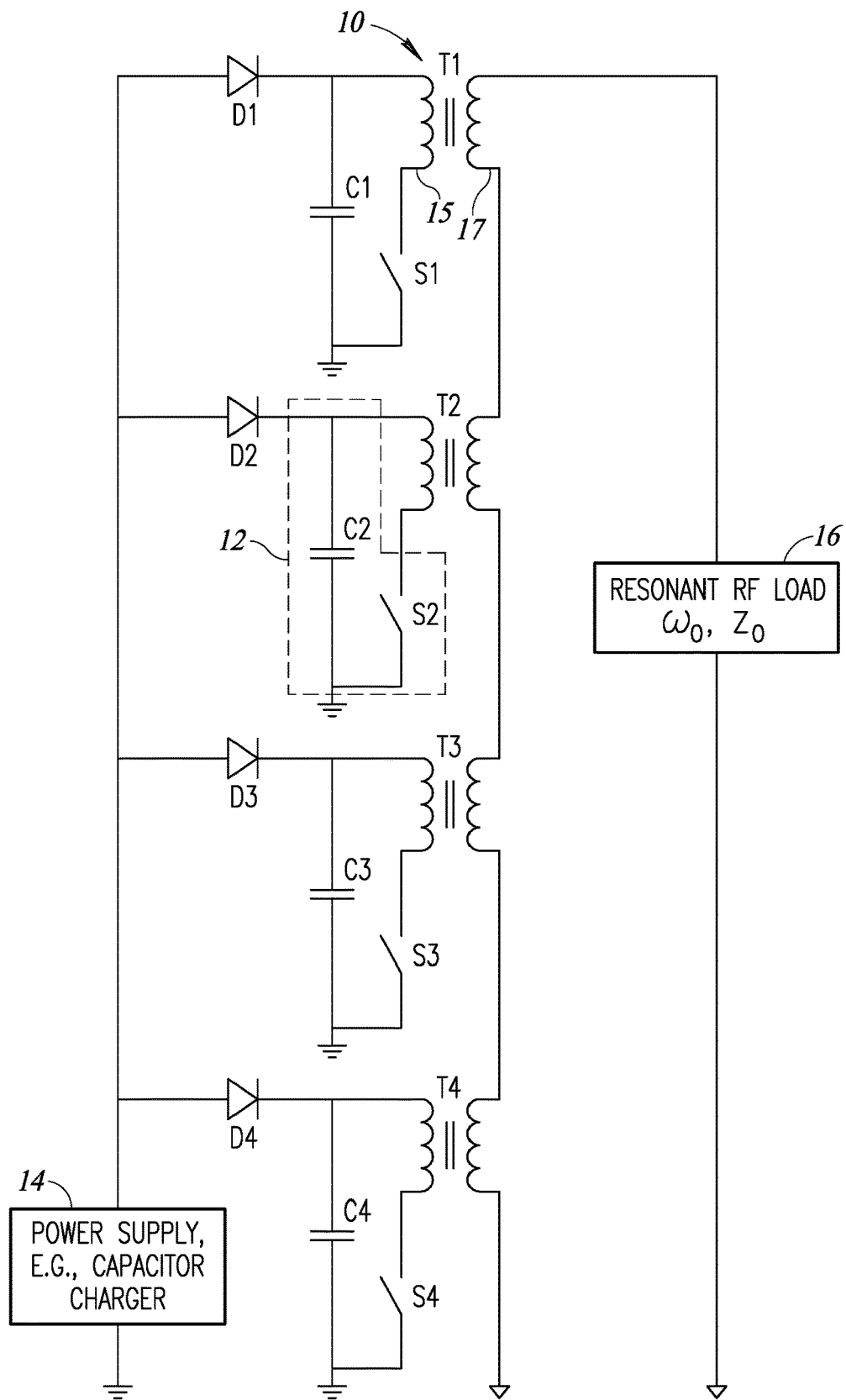
FIG. 1 is a high level schematic diagram illustrating an inductively coupled pulsed RF voltage multiplier, in accordance with one or more embodiments.

FIG. 1 is a high level schematic diagram illustrating an inductively coupled pulsed RF voltage multiplier 10, in accordance with one or more embodiments. As shown in FIG. 1, the inductively coupled pulsed RF voltage multiplier 10 includes a plurality of switching stages 12. Each of the switching stages 12 includes a respective switching stage capacitor $C_1$-$C_4$, and a respective switch $S_1$-$S_4$. The switching stages 12 are electrically coupled to one another in parallel. The switching stages 12 are further electrically coupled to primary windings 15 of respective transformers $T_1$-$T_4$, as shown in FIG. 1.

The capacitors $C_1$-$C_4$ are charged to a DC voltage by a power supply 14, which in various implementations may be a capacitor charger or a DC voltage supply. In operation, the switches $S_1$-$S_4$ are simultaneously or concurrently triggered to transition from a non-conducting state to a conducting state at some time after the capacitors $C_1$-$C_4$ are suitably charged. At this time, i.e., with the switches $S_1$-$S_4$ in the conducting state, the capacitors $C_1$-$C_4$ begin to discharge through the primary windings 15 of the inductively coupled transformers $T_1$-$T_4$. In the particular implementation shown in FIG. 1, the charging voltage is multiplied by a factor of four across the resonant load 16 by virtue of the series connection between the secondary windings 17 of the inductively coupling transformers $T_1$-$T_4$. The switched energy resonates in the tuned RF load 16, creating a high voltage RF pulse.

Figure 2:
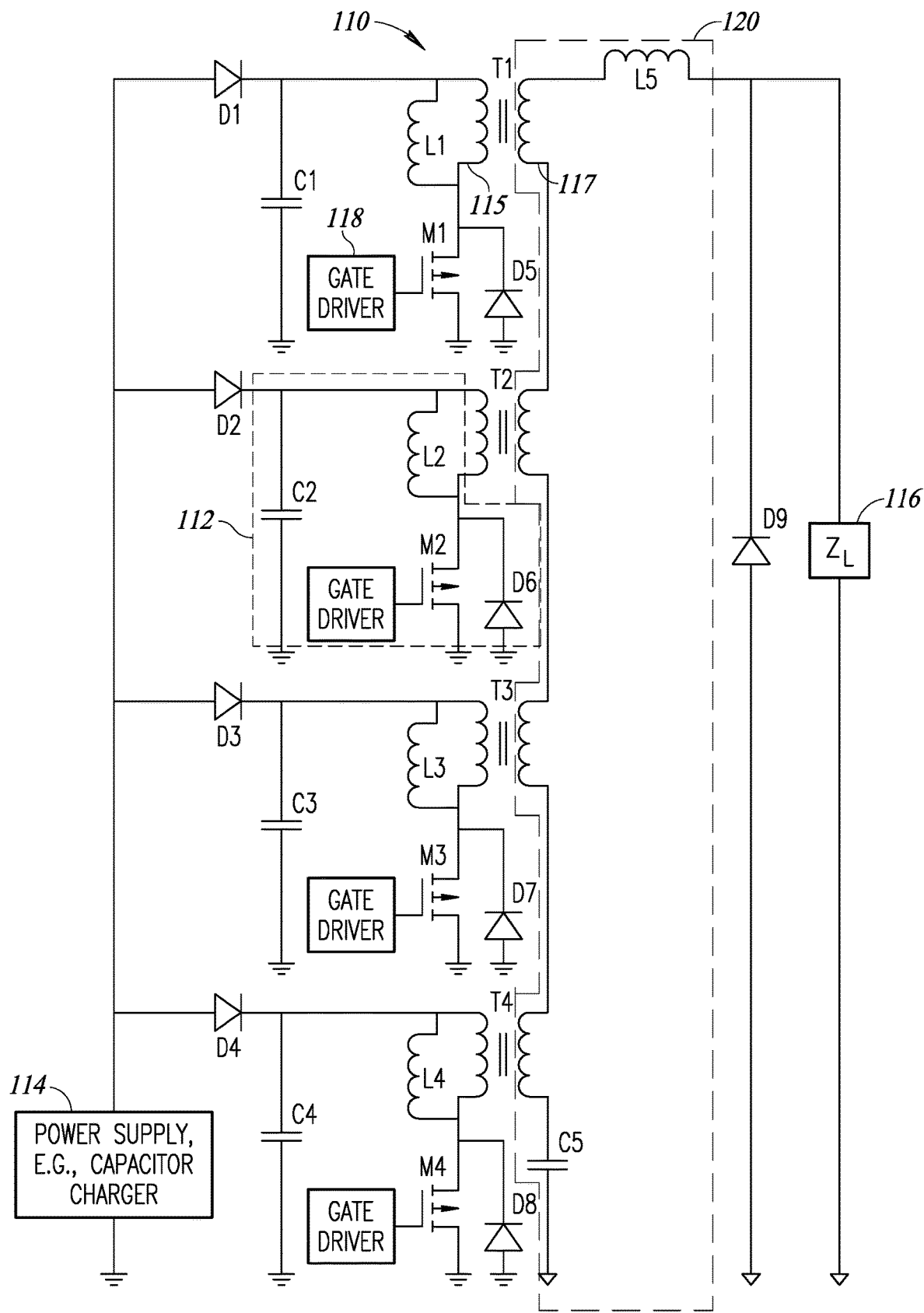
FIG. 2 is a schematic diagram illustrating an inductively coupled pulsed RF voltage multiplier that drives a diode opening switch that converts the RF electrical energy into a unipolar pulse generated across a load impedance, in accordance with one or more embodiments.

FIG. 2 is a schematic diagram illustrating an inductively coupled pulsed RF voltage multiplier 110 that drives a diode opening switch D9 that converts the RF electrical energy into a unipolar pulse generated across a load impedance 116, in accordance with one or more embodiments. As shown in FIG. 2, the inductively coupled pulsed RF voltage multiplier 110 may be coupled to a power supply 114, such as a capacitor charger, and diodes $D_1$-$D_4$ that isolate the power supply 114 from the inductively coupled pulsed RF voltage multiplier 110 circuitry. The inductively coupled pulsed RF voltage multiplier 110 may include a plurality of capacitors $C_1$-$C_4$ that are charged by the capacitor charger, a plurality of switches, such as MOSFETs $M_1$-$M_4$ with anti-parallel diodes $D_5$-$D_8$ to switch the capacitors $C_1$-$C_4$ into the resonating RF circuit, transformers $T_1$-$T_4$ to provide the inductive coupling and voltage multiplication, inductors $L_1$-$L_5$ and an additional capacitor $C_5$ to form the resonant circuit, and a diode opening switch $D_9$ to form a high voltage nanosecond-scale pulse that may be applied to a load $Z_L$ that absorbs the nanosecond-scale pulse. The nanosecond-scale pulse may be a pulse having a length of equal to or less than 100 nanoseconds at the full-width-at-half-maximum (FHWM) and an amplitude of at least 1 kV. In one or more embodiments, the nanosecond-scale pulse may have a length within a range of 10 nanoseconds, inclusive, to 10 nanoseconds, inclusive, at the FHWM. In one or more embodiments, the pulse may have an amplitude within a range of 10 kV, inclusive, to 40 kV, inclusive. In some embodiments, the pulse has an amplitude that is greater than 40 kV.

FIG. 2 depicts a configuration in which four switching stages 112 are inductively coupled by transformers $T_1$-$T_4$ to provide a voltage multiplication factor of 4, meaning that the voltage that is switched across the series combination of the inductor $L_5$ and the diode opening switch $D_9$ is four times higher than the charge voltage provided by the power supply 114, which may be a capacitor charger. In general, the number of switching stages 112 may be as many as desired depending on application, from 1 up to N stages, where N is the number of switching stages 112 required to achieve the desired output voltage. Each of the switching stages 112 includes a respective switching stage capacitor $C_1$-$C_4$, a respective switching stage inductor $L_1$-$L_4$, and a respective switch, such as MOSFETs $M_1$-$M_4$. Each of the switching stages 112 thus includes respective LC or resonant switching stage circuits that include the respective switching stage capacitors and the switching stage inductors. The switching stages 112 are electrically coupled to one another in parallel. The switching stages 112 are further electrically coupled to primary windings 115 of respective transformers $T_1$-$T_4$, as shown in FIG. 2. The secondary windings 117 of the transformers $T_1$-$T_4$ are coupled in series to one another and to a resonant circuit 120 that includes the inductor $L_5$ and the capacitor $C_5$. The secondary windings 117 of the transformers $T_4$ may be included as part of the resonant circuit 120.

As shown in FIG. 2, the capacitors $C_1$-$C_4$ may be switched into the resonant circuit 120 by the MOSFETs $M_1$-$M_4$. The MOSFETs $M_1$-$M_4$ may preferably be used as a switching element in one or more embodiments due to their fast turn-on time; however, other switches may be used, including, but not limited to, insulated gate bipolar transistors (IGBTs), thyristors, silicon controlled thyristors, bipolar junction transistors, other field effect transistors, thyratrons, spark gap switches, photoconductive solid state switches, or any solid state, avalanche, optically triggered or gas discharge switches. Depending on the switching technology used, anti-parallel diodes $D_5$-$D_8$ may be employed in the switching stages 112 to provide a reverse conduction path across the switch, though they may not be included, for example, if the switching technology employed is capable of conducting in the reverse direction. In practice, the chosen switching technology should feature a turn-on time that is a fraction of one-quarter of the resonant period of the resonant circuit 120 to avoid excessive switching loss.

Each of the switches (e.g., MOSFETs $M_1$-$M_4$) of the switching stages 112 may include a plurality of switching elements that are electrically coupled to one another in parallel, series, or series-parallel in order to increase an effective voltage and a current rating of each of the switches.

In operation, MOSFETs $M_1$-$M_4$ are simultaneously or concurrently triggered to conduct electrical current at some time after capacitors $C_1$-$C_4$ are fully or otherwise suitably charged by the power supply 114, e.g., the capacitor charger. The MOSFETs $M_1$-$M_4$ may be controlled by any control circuit, such as by one or more gate driver circuits 118 that selectively control the MOSFETs $M_1$-$M_4$ to operate in conductive and non-conductive states. When the MOSFETs $M_1$-$M_4$ are trigged to operate in their conductive states, the switching stage inductors $L_1$-$L_4$ are connected in parallel across the switching stage capacitors $C_1$-$C_4$, respectively, forming a plurality of switching stage resonant circuits, each including a respective switching stage inductor $L_1$-$L_4$ and a respective switching stage capacitor $C_1$-$C_4$. The impedance of these parallel resonant switching stage circuits appears on the secondary side of transformers $T_1$-$T_4$ across the series combination of the inductor $L_5$ and the diode opening switch $D_9$ as an equivalent parallel tank circuit with an equivalent capacitance of $1/C_{eq}=1/C_1+1/C_2+1/C_3+1/C_4$ and an equivalent inductance of $L_{eq}=L_1+L_2+L_3+L_4$. In general, when N switching stages are used, the equivalent capacitance and inductance is given by $1/C_{eq}=1/C_1+1/C_2+\ldots+1/C_{N-1}+1/C_N$ and $L_{eq}=L_1+L_2+\ldots+L_{N-1}+L_N$. This equivalent parallel tank circuit resonates in conjunction with the resonant circuit 120 including the capacitor $C_5$ and the inductor $L_5$ to pump the diode opening switch $D_9$.

When the MOSFETs $M_1$-$M_4$ are concurrently switched from electrically non-conductive state into electrically conductive states, the electrical energy that is initially stored in the switching stage capacitors $C_1$-$C_4$ as a uniform DC voltage is converted to a radio frequency (RF) voltage. The switching stage capacitors $C_1$-$C_4$ discharge the stored electrical energy into the inductively coupled resonant circuit 120 to achieve an effective switching voltage that is higher than the DC charging voltage by a multiplying factor. The multiplying factor is dependent on the number of switching stages 112, and in the example shown in FIG. 2, the multiplying factor is four.

In the preferred implementation, inductive coupling between the switching stages 112 and the resonant circuit 120 is achieved by the transformers $T_1$-$T_N$, where N is the number of switching stages 112. As shown in FIG. 2, the inductively coupled pulsed RF voltage multiplier 110 may include four transformers; however, fewer or more transformers may be included. To achieve a high degree of inductive coupling, transformers having toroidal magnetic cores with high magnetic permeability may be used in one or more embodiments, though in other embodiments the inductive coupling may be achieved generally by any structure with a mutual inductance between two conductors. Such structures may or may not use magnetic materials to increase the magnetic susceptibility of the medium that couples the magnetic fields to create a mutual inductance. In general, the primary and secondary conductors that form the transformer may be wound in an aircore configuration, or wound on or around a magnetic material, such as nanocrystalline ribbon, ferrite, iron powder, and other crystalline or amorphous magnetic materials. In implementations in which the transformers are aircore transformers, the magnetizing inductance of the aircore transformers may be sufficiently small to resonate as part of the overall pulsed RF circuitry, creating a resonantly tuned, inductively coupled pulsed RF voltage multiplier.

In one or more implementations, the transformers $T_1$-$T_N$ have a same number of turns on the primary winding 115 and the secondary winding 117 to achieve a 1:1 transformation ratio. In such implementations, electrical energy is switched into the primary winding 115 of each transformer, which is referenced to a common equipotential, and the secondary winding 117 of each transformer is connected in series to the secondary winding 117 of the neighboring transformers. Accordingly, the overall voltage multiplication provided is given by N, where N is the number of transformers and the number of switching stages 112 included in the inductively coupled pulsed RF voltage multiplier 110.

In one or more implementations, the transformers $T_1$-$T_N$ have an unequal number of turns on the primary winding 115 and the secondary winding 117 to achieve a 1:n transformation ratio. In such embodiments, electrical energy is switched into the primary winding 115 of each transformer, which is referenced to a common equipotential, and the secondary winding 117 of each transformer is connected in series to the secondary winding of the neighboring transformers. Accordingly, the overall voltage multiplication provided is given by n×N, where n is the turns ratio of the transformers and N is the number of transformers.

The transformers $T_1$-$T_N$ may by designed such that the non-coupled magnetic field on the secondary side of the transformers may form an effective leakage inductance that is equal to or less than the desired value of the inductor $L_5$. In the case that the effective leakage inductance is equal to the desired value of the inductor $L_5$, the inductor $L_5$ may be eliminated from the circuit, as the inductance is part of the transformers themselves.

The dynamic behavior of the pulsed RF energy and the peak value of the oscillating current is determined based on the arrangement and values of the inductance and capacitance in the inductively coupled pulsed RF voltage multiplier 110 circuitry. In various embodiments, the pulsed RF circuitry is used to drive a diode opening switch. In various embodiments, a practical range for the natural frequency of resonating inductance and capacitance is between 100 kHz and 10 MHz. The impedance of the resonant circuit can be chosen by a user or circuit designer as desired, depending on application. In one or more embodiments, the overall equivalent impedance of the resonant circuit may be between 1Ω and 1,000Ω.

The resonant circuit, e.g., the resonant circuit 120 on the secondary winding side of the transformers, may include various discrete passive components, including inductors, capacitors, and resistors, all of which may be selected and arranged in the circuit as desired to obtain the desired dynamics and instantaneous power of the pulsed RF energy.

In one or more embodiments, the diode opening switch $D_9$ includes an array of diode opening switches.

The various embodiments and examples described above are provided by way of illustration only and should not be construed to limit the claimed invention, nor the scope of the various embodiments and examples. Those skilled in the art will readily recognize various modifications and changes that may be made to the claimed invention without following the example embodiments and applications illustrated and described herein, and without departing from the true spirit and scope of the claimed invention, which is set forth in the following claims.

Various structures, articles, and methods described herein may be advantageously employed in specific applications or with other structures, articles, and methods, such as those described in U.S. Provisional Patent Application No. 61/717,044, filed Oct. 22, 2012; U.S. Non-Provisional patent application Ser. No. 14/052,437, filed Oct. 11, 2013 (published as US 2014/0109886); U.S. Provisional Patent Application No. 61/916,693 filed Dec. 16, 2013; U.S. Non-Provisional patent application Ser. No. 14/571,128 filed Dec. 15, 2014 (granted as U.S. Pat. No. 9,617,965); and U.S. Non-Provisional patent application Ser. No. 15/444,112, filed Feb. 27, 2017 (published as US 2017/0167464), and U.S. Provisional Patent Application No. 62/620,278, filed Jan. 22, 2018, each of which is incorporated herein by reference in their entireties.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for generating a pulsed radio frequency (RF) waveform, comprising:
voltage multiplying a DC charging voltage by:
supplying the DC charging voltage to respective capacitors of a plurality of switching stages that are electrically coupled to one another in parallel, each of the switching stages including a switching stage capacitor, a switching stage inductor, and a switch; and
discharging the capacitors by concurrently switching the switches of each of the plurality of switching stages from an electrically non-conducting state to an electrically conducting state; and
inductively coupling each of the plurality of switching stages to a resonant circuit through a plurality of transformers, each of the transformers having a primary winding electrically coupled to a respective switching stage and a secondary winding electrically coupled in series to one another and to the resonant circuit,
wherein the resonant circuit includes an inductor and a capacitor electrically coupled in series to the secondary windings of the transformers.

2. The method of claim 1 wherein each of the transformers have a same number of turns on the primary winding and the secondary winding to achieve a 1:1 transformation ratio.

3. The method of claim 1 wherein each of the transformers have an unequal number of turns on the primary winding and the secondary winding to achieve a 1:n transformation ratio.

4. The method of claim 1 wherein each of the transformers includes two or more windings on a magnetic material.

5. The method of claim 4 wherein the magnetic material includes at least one of: nanocrystalline ribbon, ferrite, iron powder, crystalline magnetic material, and amorphous magnetic material.

6. The method of claim 1 wherein the transformers are air core transformers and each transformer includes two or more windings on a non-magnetic structure.

7. The method of claim 1 wherein the resonant circuit includes a leakage inductance due to uncoupled magnetic fields of the secondary windings of the transformers, and a value of the leakage inductance is tuned with the resonant circuit.

8. The method of claim 1, further comprising: converting the DC charging voltage from a uniform DC voltage stored in the switching stage capacitors to a radio frequency (RF) voltage by the concurrently switching the switches of each of the plurality of switching stages from the electrically non-conducting state to the electrically conducting state.

9. The method of claim 1 wherein each of the switches of the switching stages includes a plurality of switching elements electrically coupled to one another in parallel, series, or series-parallel to increase an effective voltage and a current rating of each of the switches.

10. The method of claim 1 wherein the switches include at least one of: field effect transistors, insulated gate bipolar transistors, thyristors, silicon controlled thyristors, bipolar junction transistors, photo conductive solid state switches, thyratrons, spark gaps, or any solid state, avalanche, optically triggered or gas discharge switches.

11. A method for generating a pulsed radio frequency (RF) waveform, the method comprising:
voltage multiplying a DC charging voltage by:
supplying the DC charging voltage to respective capacitors of a plurality of switching stages that are electrically coupled to one another in parallel, each of the switching stages including a switching stage capacitor, a switching stage inductor, and a switch; and
discharging the capacitors by concurrently switching the switches of each of the plurality of switching stages from an electrically non-conducting state to an electrically conducting state; and
inductively coupling each of the plurality of switching stages to a resonant circuit through a plurality of transformers, each of the transformers having a primary winding electrically coupled to a respective switching stage and a secondary winding electrically coupled in series to one another and to the resonant circuit,
generating a pulsed RF waveform by the inductively coupling each of the plurality of switching stages to the resonant circuit through the plurality of transformers; and
driving an opening switch with the pulsed RF waveform to convert RF energy of the pulsed RF waveform into a unipolar pulse.

12. The method of claim 11 wherein the opening switch includes at least one of a diode or an array of diodes.

13. The method of claim 11 wherein a natural frequency of the pulsed RF waveform that drives the diode opening switch is between 100 kHz, inclusive, and 10 MHz, inclusive, and an equivalent resonant impedance of the resonant circuit is between 0.1Ω, inclusive, and 1,000Ω, inclusive.

14. An inductively coupled pulsed radio frequency (RF) voltage multiplier circuit, comprising:

a plurality of switching circuits coupled to one another in parallel, each of the switching circuits including:
a switching circuit capacitor,
a switching circuit inductor, and
a switch;
a plurality of transformers, each of the transformers having a respective primary winding electrically coupled to a respective one of the switching circuits; and
a resonant circuit inductively coupled to the plurality of switching circuits through secondary windings of each of the plurality of transformers, the secondary windings of the plurality of transformers being electrically coupled to one another in series,
wherein the resonant circuit includes an inductor and a capacitor electrically coupled in series to the secondary windings of the plurality of transformers.

15. The pulsed RF voltage multiplier circuit of claim 14 wherein the resonant circuit includes an inductance and a capacitor electrically coupled in series to the secondary windings of the plurality of transformers, the inductance including a leakage inductance due to uncoupled magnetic fields of the secondary windings of the transformers.

16. The pulsed RF voltage multiplier circuit of claim 15, further comprising a load, wherein the diode opening switch is configured to deliver a RF voltage pulse to the load.

17. The pulsed RF voltage multiplier circuit of claim 14, further comprising a control circuit that selectively controls the switches of each of the plurality of switching circuits to concurrently switch from an electrically non-conducting state to an electrically conducting state.

18. The pulsed RF voltage multiplier circuit of claim 14, further comprising a diode opening switch electrically coupled to the resonant circuit.

\* \* \* \* \*